United States Patent
Naganuma et al.

(10) Patent No.: US 9,393,784 B2
(45) Date of Patent: Jul. 19, 2016

(54) PIEZOELECTRIC ELEMENT, LIQUID EJECTING HEAD, AND LIQUID EJECTING APPARATUS

(71) Applicant: SEIKO EPSON CORPORATION, Tokyo (JP)

(72) Inventors: Yoichi Naganuma, Matsumoto (JP); Eiju Hirai, Minowa-machi (JP); Motoki Takabe, Shiojiri (JP); Yuma Fukuzawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/845,567

(22) Filed: Sep. 4, 2015

(65) Prior Publication Data
US 2016/0067967 A1 Mar. 10, 2016

(30) Foreign Application Priority Data
Sep. 8, 2014 (JP) ................. 2014-181910

(51) Int. Cl.
*B41J 2/14* (2006.01)
*H01L 41/047* (2006.01)

(52) U.S. Cl.
CPC .......... *B41J 2/14201* (2013.01); *B41J 2/14233* (2013.01); *H01L 41/047* (2013.01)

(58) Field of Classification Search
CPC ............... B41J 2/14201; B41J 2/14233; B41J 2/14258; B41J 2/14274
See application file for complete search history.

(56) References Cited

U.S. PATENT DOCUMENTS

2013/0194353 A1  8/2013  Hirai et al.
2014/0253641 A1*  9/2014  Furuya ................. B41J 2/14201
                                                         347/71

FOREIGN PATENT DOCUMENTS

JP         2013-158909 A        8/2013

* cited by examiner

*Primary Examiner* — Geoffrey Mruk
(74) *Attorney, Agent, or Firm* — Workman Nydegger

(57) ABSTRACT

A piezoelectric element includes a vibration plate that has a first region that is allowed to flexurally deform and a second region that is at an outer side of the first region and that is inhibited from flexurally deforming, a piezoelectric element main body in which a lower electrode layer, a piezoelectric material layer, and an upper electrode layer are stacked in that order on the first region of the vibration plate, and a common metal layer stacked on the upper electrode layer, with a common close adherence layer interposed therebetween. A portion of the piezoelectric element main body extends into the second region. In an extension-side region, that is, a region at a side of extension of the portion of the piezoelectric element into the second region, the common metal layer is formed continuously from a location that overlies the first region to a location that overlies the second region and the common close adherence layer extends beyond a location that overlies the common metal layer to an end portion of the upper electrode layer.

3 Claims, 5 Drawing Sheets

PIEZOELECTRIC ELEMENT, LIQUID EJECTING HEAD, AND LIQUID EJECTING APPARATUS

The entire disclosure of Japanese Patent Application No: 2014-181910, filed Sep. 8, 2014 is expressly incorporated by reference herein in its entirety.

BACKGROUND

1. Technical Field

The present invention relates to a piezoelectric element that has a piezoelectric material layer interposed between electrode layers that make a pair. The invention also relates to a liquid ejecting head and a liquid ejecting apparatus that use the piezoelectric element.

2. Related Art

Liquid ejecting apparatuses are equipped with liquid ejecting heads, and eject various types of liquid from the liquid ejecting head. Such liquid ejecting apparatuses include, for example, image recording apparatuses, such as, ink jet type printers, ink jet type plotters, etc., and have also recently been applied to various kinds of production apparatuses by making use of the apparatuses' feature of being capable of accurately depositing very small amounts of liquid at predetermined positions. Examples of use of liquid ejecting apparatuses in production apparatuses include a display production apparatus for producing a color filter for a liquid crystal display or the like, an electrode forming apparatus for forming electrodes of an organic electro-luminescence (EL) display, a surface emitting display (SED), etc., and a chip production apparatus for producing a bio-chip (biochemical device). While a recording head for an image recording apparatus ejects liquid inks, a color material ejecting head for a display production apparatus ejects solutions of color materials of red (R), green (G) and blue (B). Furthermore, an electrode material ejecting head for an electrode forming apparatus ejects an electrode material in a liquid state, and a bioorganic material ejecting head for a chip production apparatus ejects a solution of a bioorganic material.

The aforementioned liquid ejecting heads each include piezoelectric elements that cause pressure changes in liquid within pressure chambers. Such a piezoelectric element is made up of, for example, a lower electrode layer that functions as an individual electrode provided for each of pressure chambers, a piezoelectric material layer of lead zirconate titanate (also termed PZT) or the like, an upper electrode layer that functions as a common electrode that is common to a plurality of pressure chambers which are formed and layered in that order from a side nearer to the pressure chamber by a film forming technology. A portion of the piezoelectric material layer disposed between the upper electrode layer and a lower electrode layer is an active portion that deforms when voltage is applied to the two electrode layers. Note that when the piezoelectric element deforms, stress may concentrate at a boundary location between the active portion and a portion that is not the active portion (non-active portion), leading to formation of cracks in the piezoelectric material layer that constitutes the piezoelectric element. Therefore, a technology in which a piezoelectric material layer and an upper electrode layer are formed so as to extend into an outer side of the pressure chamber in the longitudinal direction so that the rigidity of the aforementioned boundary location in the piezoelectric element is increased (see, e.g., JP-A-2013-158909) has been disclosed.

However, there are cases where the adoption of the foregoing construction does not sufficiently inhibit occurrence of a defective condition in which cracks are formed in the piezoelectric material layer.

SUMMARY

An advantage of some aspects of the invention is that a piezoelectric element, a liquid ejecting head, and a liquid ejecting apparatus which are capable of more certainly inhibiting formation of a crack in the piezoelectric material layer.

A piezoelectric element of the invention includes a support body having a first region that is allowed to flexurally deform and a second region that is at an outer side of the first region and that is inhibited from flexurally deforming, a piezoelectric element main body in which a first electrode layer, a piezoelectric material layer, and a second electrode layer are stacked in that order on the first region of the support body, and a metal layer that is stacked on the second electrode layer, with a close adherence layer interposed between the metal layer and the second electrode layer. A portion of the piezoelectric element main body extends into the second region. In an extension-side region that is a region at a side of extension of the portion of the piezoelectric element main body into the second region, the metal layer is formed continuously from a location that overlies the first region to a location that overlies the second region and the close adherence layer extends beyond a location that overlies the metal layer to an end portion of the second electrode layer.

A liquid ejecting head of the invention includes a piezoelectric element constructed as described above. A liquid ejecting apparatus of the invention includes a liquid ejecting head constructed as described above.

According to the invention, since at a boundary between the first region and the second region, the metal layer restricts movement of the piezoelectric element main body, excessive deformation of the piezoelectric element main body can be inhibited. Therefore, the stress that occurs at a boundary location between an active portion and a non-active portion can be weakened. Furthermore, since the piezoelectric element main body extends into the second region and the close adherence layer extends to the second electrode layer that is at the outer side of the metal layer, concentration of stress at a boundary location between the end portion of the second electrode layer, that is, the active portion, and the non-active portion can be inhibited. Therefore, when the piezoelectric element main body is deformed, a defective condition in which cracks or the like occur in the piezoelectric material layer can be more certainly inhibited. Consequently, the reliability of the piezoelectric element improves and, therefore, the reliability of the liquid ejecting head and the liquid ejecting apparatus improves.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention will be described hereinafter with reference to the accompanying drawings. Although in the exemplary embodiments below, various limitations are provided as preferred concrete examples of the invention, the scope of the invention is not restricted by the following embodiments or the like unless otherwise particularly mentioned in the description below. Furthermore, in the following description, an example in which a piezoelectric element according to the invention is used as an actuator for ejecting ink an ink jet type printer (hereinafter, referred to as printer), a type of liquid discharge apparatus in which an ink jet type recording head (hereinafter, referred to as recording head) that is a type of liquid discharge head is mounted will be presented.

Figure 1:
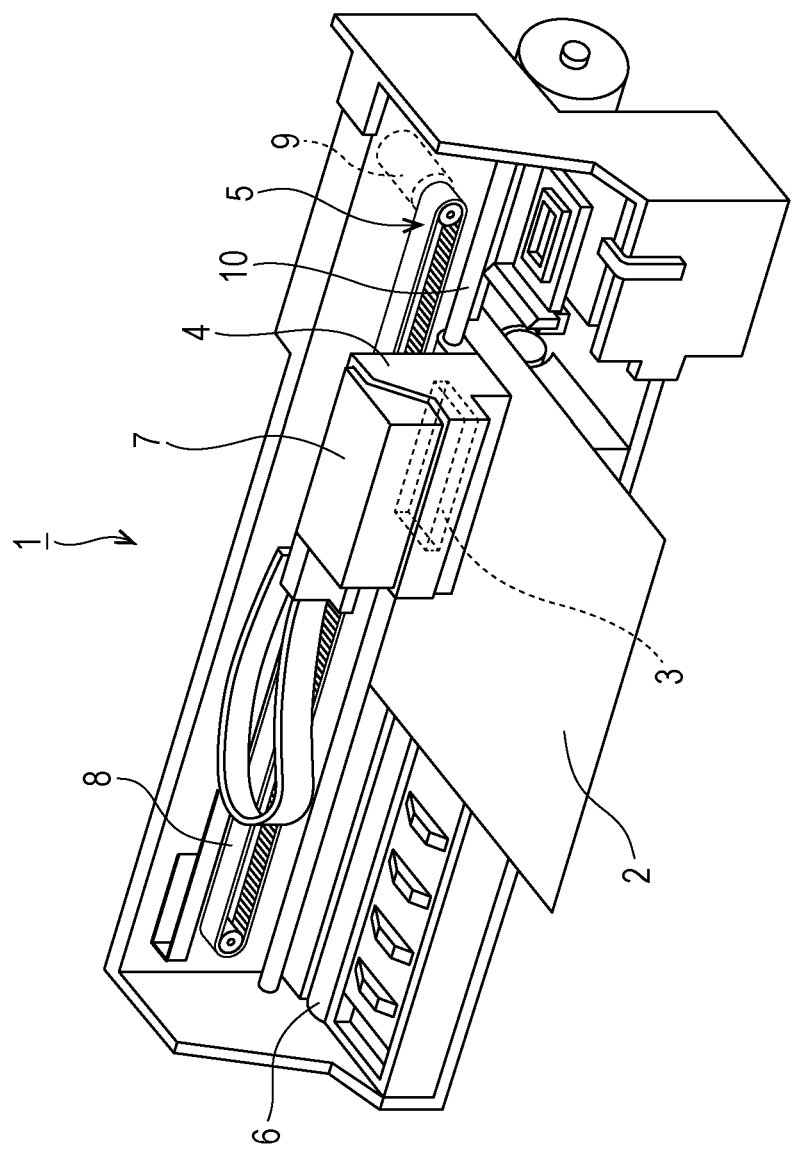
FIG. 1 is a perspective view illustrating a construction of a printer.

A construction of a printer 1 will be described with reference to FIG. 1. The printer 1 is an apparatus that records images and the like by ejecting ink in a liquid form to a surface of a recording medium 2 (a kind of an object on which to form deposits) such as recording paper. This printer 1 includes a recording head 3, a carriage 4 to which the recording head 3 is attached, a carriage moving mechanism 5 that moves the carriage 4 in a main scanning direction, etc. Furthermore, the printer includes a mechanism that moves the recording medium 2 in a subsidiary scanning direction, for example, a platen roller 6. This moving mechanism may include not only the platen roller 6 but also a drum and the like. The aforementioned ink, a kind of liquid, is reserved in an ink cartridge 7 as a liquid supply source. The ink cartridge 7 is detachably fitted to the recording head 3. Incidentally, a construction in which the ink cartridge 7 is disposed on a main body side of the printer 1 and ink is supplied from the ink cartridge 7 to the recording head 3 through an ink supply tube can also be adopted.

The carriage moving mechanism 5 has a timing belt 8. The timing belt 8 is driven by a pulse motor 9 such as a direct-current (DC) motor. Therefore, when the pulse motor 9 operates, the carriage 4, guided by a guide rod 10 that is supported by and extends in the printer 1, is moved back and forth in the main scanning direction (the width direction of the recording medium 2).

Figure 2:
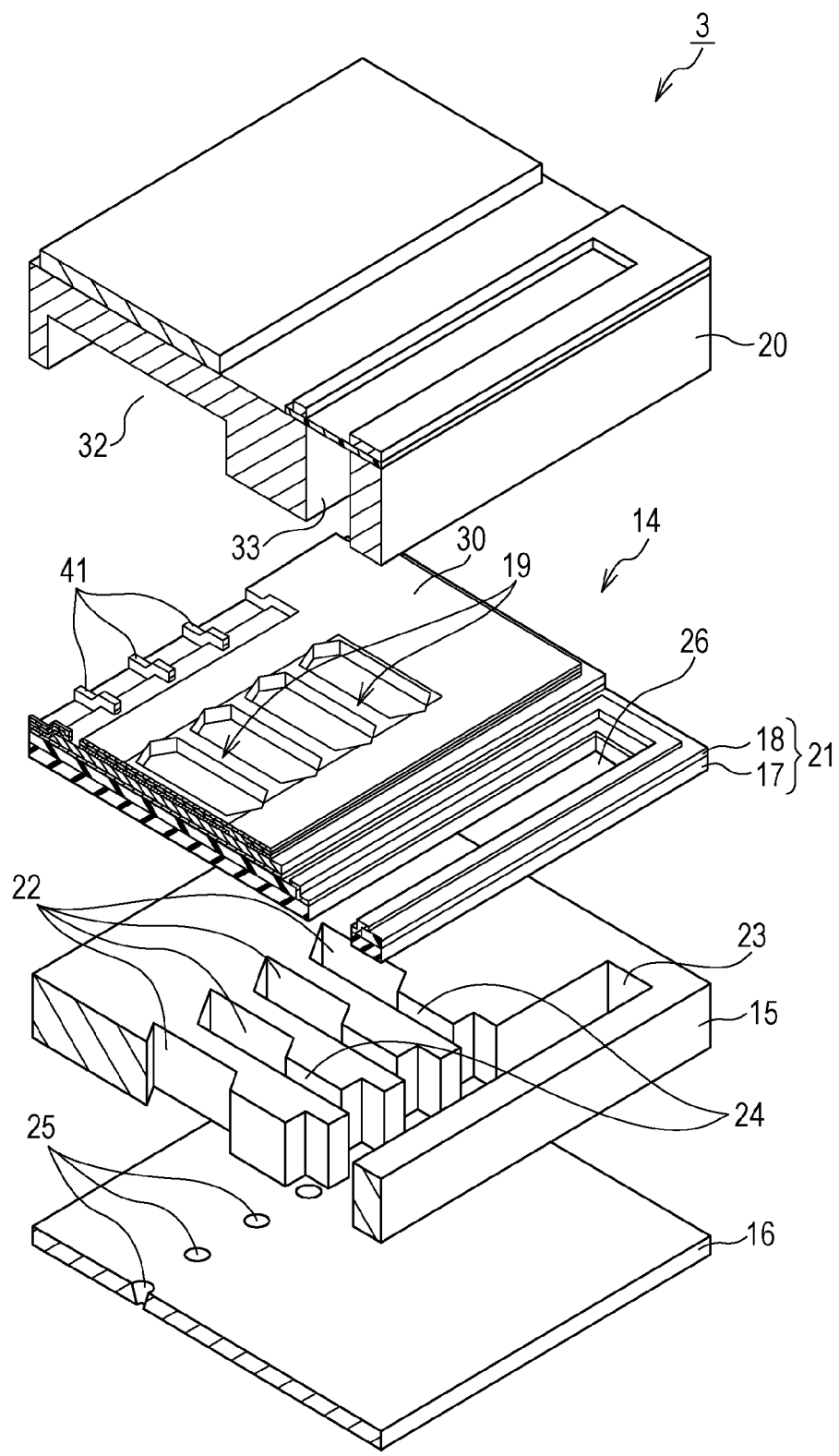
FIG. 2 is an exploded perspective view of a recording head.
Figure 3:
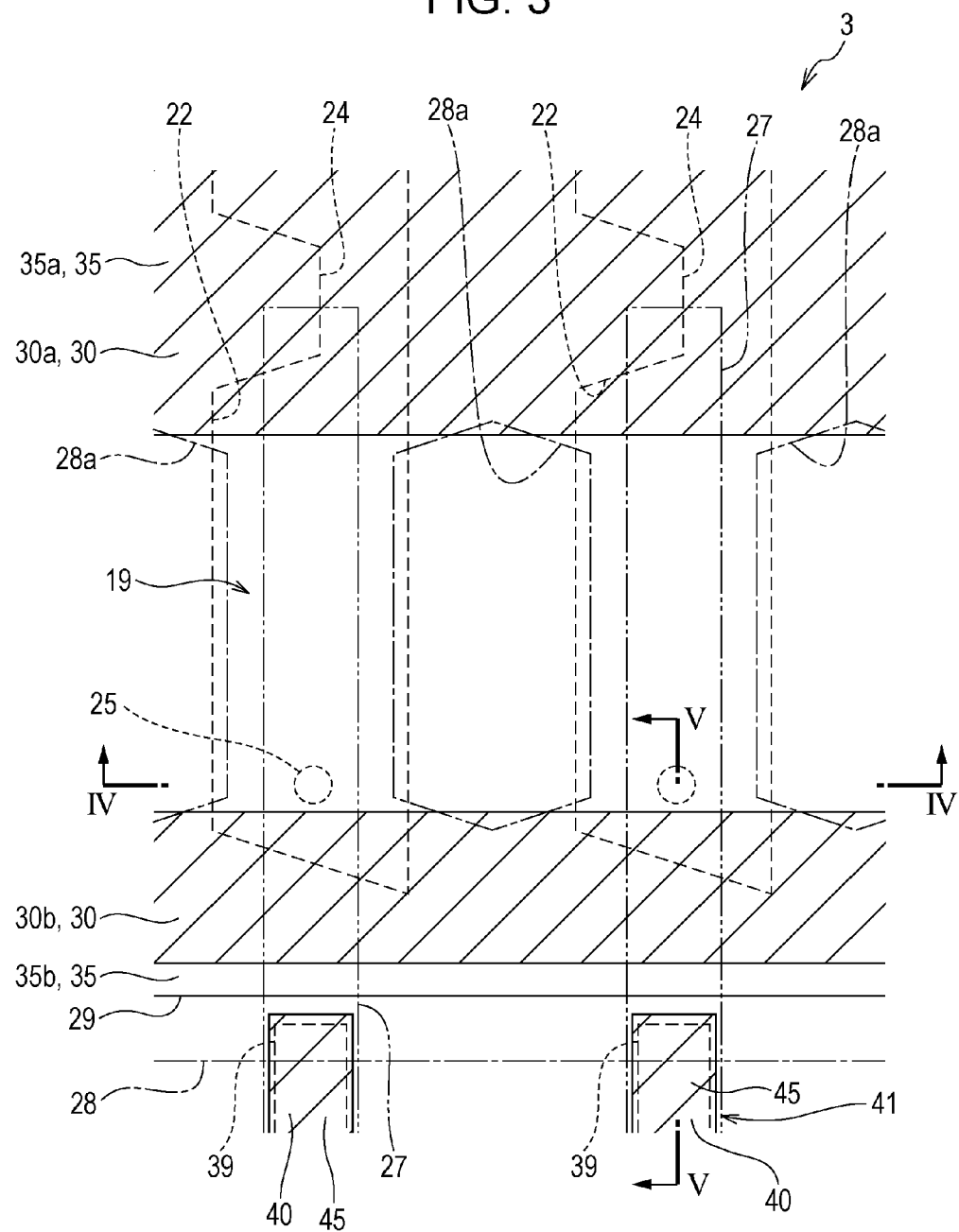
FIG. 3 is a plan view of portions of the recording head.
Figure 4:
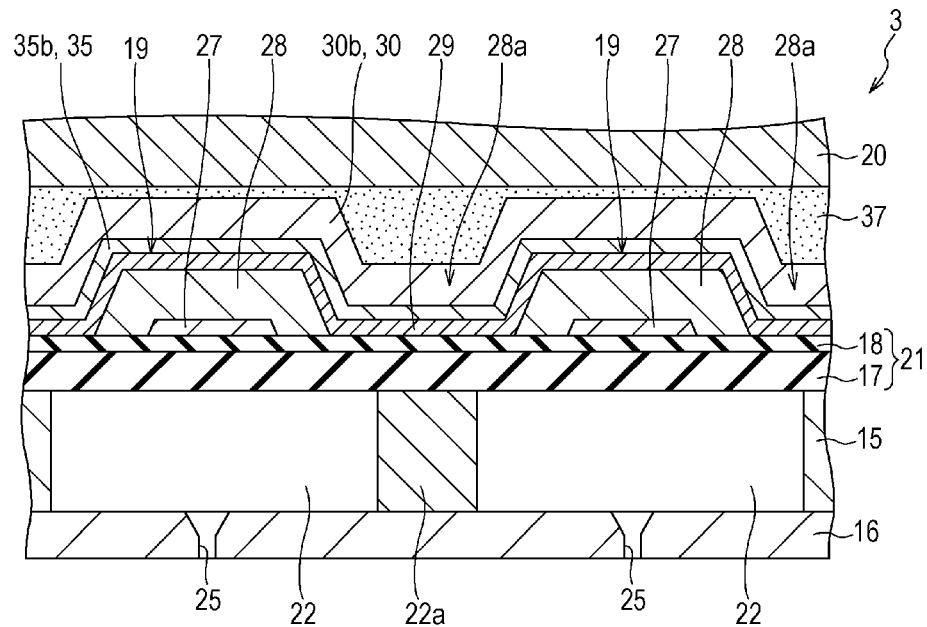
FIG. 4 is a sectional view taken on line IV-IV in FIG. 3.
Figure 5:
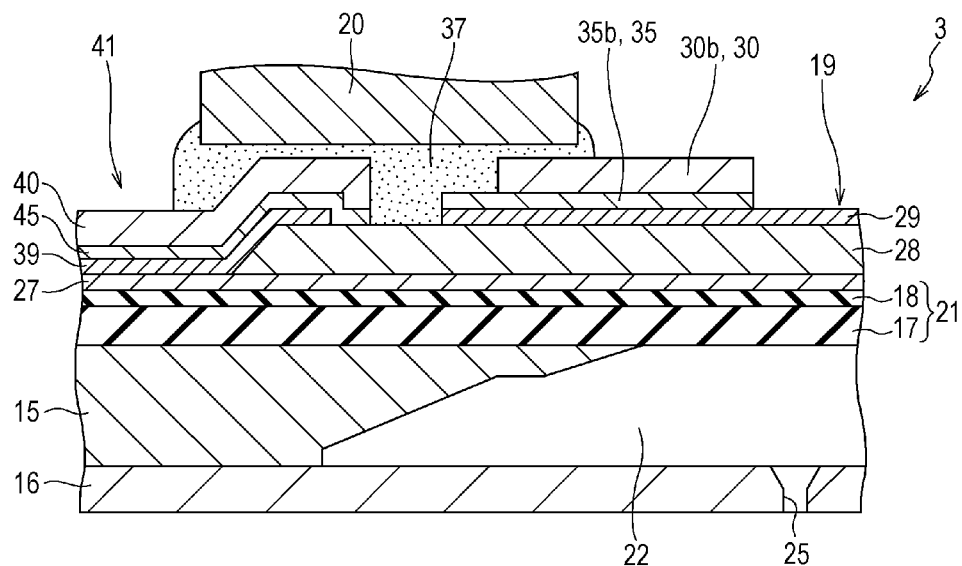
FIG. 5 is a sectional view taken on line V-V in FIG. 3.

FIG. 2 to FIG. 5 are schematic diagrams illustrating a construction of the recording head 3 in this exemplary embodiment. In particular, FIG. 2 is an exploded perspective view of the recording head 3 and FIG. 3 is a plan view (top view) of portions of the recording head 3. Furthermore, FIG. 4 is a sectional view taken on line IV-IV in FIG. 3 and FIG. 5 is a sectional view taken on line V-V in FIG. 3. Note that FIG. 3 illustrates a state in which a closure plate 20 described below is not joined. More specifically, FIG. 3 is a plan view of a vibration plate 21 in which various layers have been stacked. In FIG. 3, hatched portions indicate metal layers (a common metal layer 30 and individual metal layers 40).

The recording head 3 in this exemplary embodiment is constructed by stacking a pressure chamber-forming substrate 15, a nozzle plate 16, an actuator unit 14, a closure plate 20, etc. The pressure chamber-forming substrate 15 in this embodiment is a plate member made of a silicon single crystal substrate. As illustrated in FIG. 4, this pressure chamber-forming substrate 15 is provided with spaces that form a plurality of pressure chambers 22 (hereinafter, termed pressure chamber spaces as appropriate). The spaces are juxtaposed and separated from each other by partition walls 22a. These pressure chamber spaces are elongated in a direction orthogonal to a nozzle row direction and correspond one-to-one to nozzles 25 formed in the nozzle plate 16. That is, the pressure chamber spaces (or the pressure chambers 22) are formed at a pitch which is equal to the pitch at which the nozzles 25 are formed in the nozzle row direction. Incidentally, the pressure chamber-forming substrate 15 in this exemplary embodiment is created by subjecting a silicon single crystal substrate with a (110) plane direction to anisotropic etching. Therefore, an upper opening of each pressure chamber space (an opening at a side opposite to the nozzle 25 side) has a trapezoidal shape as shown in FIG. 3. Furthermore, as shown in FIG. 5, an inner wall of each pressure chamber 22 in its longitudinal direction forms an inclined surface that is partially inclined. An intermediate portion of the inclined surface has been formed as a stepped portion.

Furthermore, as shown in FIG. 2, a region in the pressure chamber-forming substrate 15 which is apart from the pressure chamber spaces to a side in the longitudinal direction of the pressure chambers (to the opposite side of the pressure chamber spaces to a side where each pressure chamber 22 communicates with a corresponding one of the nozzles 25) is provided with a communication portion 23 that extends through the thickness of the pressure chamber-forming substrate 15. The communication portion 23 is formed along the direction of juxtaposition of the pressure chamber spaces. This communication portion 23 is a cavity common to the pressure chamber spaces. The communication portion 23 communicates with the pressure chamber spaces via their respective ink supply paths 24. Incidentally, the communication portion 23 communicates with a communication opening portion 26 of the vibration plate 21 (described below) and with a liquid chamber cavity 33 of the closure plate 20, whereby a reservoir (common liquid chamber) that is an ink chamber common to the pressure chamber spaces (pressure chambers 22) is formed. The ink supply paths 24 have a smaller width than the pressure chambers 22, and provide flow path resistance to the ink that flows from the communication portion 23 into the pressure chambers 22.

The nozzle plate 16 is joined, via an adhesive, a thermo-welding film, or the like, to a lower surface of the pressure chamber-forming substrate 15 (the surface on the opposite side thereof to the surface joined to the actuator unit 14). The nozzle plate 16 in this exemplary embodiment is provided with the nozzles 25 that are juxtaposed at a pitch (center-to-center distance between adjacent nozzles) that corresponds to a dot formation density (e.g., 300 dpi). As shown in FIG. 3, each nozzle 25 communicates with a corresponding one of the pressure chamber spaces, at an end portion thereof opposite to the ink supply path 24. Incidentally, the nozzle plate 16 is made of, for example, glass ceramics, a silicon single crystal substrate, stainless steel, etc.

The actuator unit 14, as shown in FIG. 2, is constructed of the vibration plate 21, piezoelectric element main bodies 19 layered on the vibration plate 21, a common metal layer 30, lead electrode portions 41, etc. The vibration plate 21 (that corresponds to a support body in the invention) is made up of an elastic film 17 that is formed on an upper surface of the pressure chamber-forming substrate 15 and an insulator film 18 formed on the elastic film 17. The elastic film 17 is preferred to be, for example, an elastic film of silicon dioxide ($SiO_2$) having a thickness of 300 to 2000 nm. The insulator film 18 is preferred to be, for example, an insulator film of zirconium oxide (ZrOx) having a thickness of 30 to 600 nm. Portions of the vibration plate 21 that correspond to the pressure chamber spaces, that is, portions that close the upper openings of the pressure chamber spaces and demarcate portions of the pressure chambers 22, are regions that are allowed to flexurally deform in a direction toward or away from the corresponding one of the nozzles 25 as the piezoelectric element main bodies 19 flexurally deform. These portions correspond to a first region in the invention. A region at an outer side of this region, that is, a region at an outer side of the pressure chamber spaces, is a region where the flexural deformation of the piezoelectric element main bodies 19 is inhibited, and corresponds to a second region in the invention. Incidentally, as shown in FIG. 2, a portion of the vibration plate 21 which corresponds to the communication portion 23 of the pressure chamber-forming substrate 15 is provided with the communication opening portion 26 that communicates with the communication portion 23.

The piezoelectric element main bodies 19 are formed on an upper surface of portions of the vibration plate 21 (insulator film 18) which correspond to the pressure chambers 22, that is, an upper surface of the first region (more specifically, on a surface thereof on the side opposite to the nozzles 25 side). The piezoelectric element main bodies 19 in this embodiment each have a configuration as shown in FIG. 4 and FIG. 5 in which a lower electrode layer 27 (that corresponds to a first electrode in the invention), a piezoelectric material layer 28, and an upper electrode layer 29 (that corresponds to a second electrode in the invention) are stacked in that order from the vibration plate 21 side by using a film forming technology. Specifically, each piezoelectric element main body 19 is a portion in which the piezoelectric material layer 28 is sandwiched between the lower electrode layer 27 and the upper electrode layer 29 and which forms an active portion where piezoelectric strain occurs when voltage is applied to the two electrode layers. Furthermore, as shown in FIG. 5, an end portion of each piezoelectric element main body 19 in this exemplary embodiment at one side in the longitudinal direction (a side opposite to the ink supply path 24) extends into a region at an outer side of the pressure chamber space in the longitudinal direction (second region). Furthermore, the common metal layer 30 is stacked on the upper electrode layer 29 in a boundary region between outer and inner sides of each pressure chamber 22 in the longitudinal direction (more specifically, the outer and inner sides of an upper opening of each pressure chamber space in the longitudinal direction), with a common close adherence layer 35 disposed therebetween. Positional relations among various layers stacked on the vibration plate 21 will be later described in detail. Further, note that a portion that is made up of the vibration plate 21, the lower electrode layers 27, the piezoelectric material layer 28, the upper electrode layer 29, the common close adherence layer 35, and the common metal layer 30 and that functions as an actuator that includes portions at the outer side of the portion that corresponds to the pressure chamber 22 corresponds to a piezoelectric element in the invention.

Incidentally, the upper electrode layer 29 and the lower electrode layers 27 can be made of various metals, such as iridium (Ir), platinum (Pt), titanium (Ti), tungsten (W), tantalum (Ta), molybdenum (Mo), etc., alloys of these metals, etc. Examples of the alloy used to make the electrodes include $LaNiO_3$. Furthermore, the piezoelectric material layer 28 may be of a ferroelectric piezoelectric material, such as lead zirconate titanate (PZT), a relaxor ferroelectric obtained by adding to the ferroelectric piezoelectric material a metal such as niobium, nickel, magnesium, bismuth, or yttrium, or the like. Other materials, for example, a non-lead material such as barium titanate, can also be used as a material of the piezoelectric material layer 28. With regard to the thicknesses of various layers, it is desirable that the thickness of the upper electrode layer 29 be set within the range of 15 to 100 nm, the thickness of the piezoelectric material layer 28 be set within the range of 0.7 to 5 μm, and the thickness of the lower electrode layers 27 be set within the range of 50 to 300 nm. Furthermore, gold (Au) or the like may be used for the common metal layer 30 and titanium, nickel, and chrome, and alloys of these metals may be used for the common close adherence layer 35.

The closure plate 20, as shown in FIG. 2, is joined, via an adhesive 37 (see FIG. 4 and FIG. 5), to an upper surface of the actuator unit 14 which is the opposite surface to the lower surface thereof that is joined to the pressure chamber-forming substrate 15. Within the closure plate 20 there is formed a housing cavity 32 capable of housing the piezoelectric element main bodies 19. Furthermore, the closure plate 20 is provided with the liquid chamber cavity 33 that is formed in a region in the closure plate 20 which is at a location outwardly apart from the housing cavity 32 in a direction orthogonal to the nozzle array and which corresponds to the communication opening portion 26 of the vibration plate 21 and the communication portion 23 of the pressure chamber-forming substrate 15. The liquid chamber cavity 33 extends through the closure plate 20 in the thickness direction so as to lie in the juxtaposition direction of the pressure chamber spaces (pressure chambers 22). As described above, the liquid chamber cavity 33 communicates with the communication opening portion 26 and the communication portion 23 in series and defines together therewith a reservoir that forms a common ink chamber for the pressure chamber spaces. Incidentally, although not depicted in the drawings, the closure plate 20 is provided with not only the housing cavity 32 and the liquid chamber cavity 33 but also wiring opening portions that extend through the closure plate 20 in the thickness direction, at a location that corresponds to a terminal region of the actuator unit 14. In the wiring opening portions, the individual metal layers 40 and the common metal layer 30 of the terminal region are exposed. Exposed portions of these metal layers 30 and 40 are electrically connected to terminals of wiring members (not depicted) from a printer main body side.

In the thus constructed recording head 3, ink is taken from the ink cartridge 7 to fill the flow path that includes the reservoir, the ink supply paths 24, the pressure chambers 22, and the nozzles 25. Then, when a drive signal is supplied from the printer main body side, an electric potential difference is created between the lower electrode layer 27 and the upper electrode layer 29 of each of specified piezoelectric element main bodies 19, thereby creating a commensurate electric field therebetween, which causes the specified piezoelectric element main bodies 19 to flexurally deform. Therefore, a region (first region) in the vibration plate 21 which corresponds to the pressure chamber 22 (the upper opening of the pressure chamber space) is displaced, so that a pressure change occurs in the pressure chamber 22. By controlling such pressure changes, ink is ejected from the nozzles 25.

Next, positional relations about various layers stacked on the vibration plate 21 will be described. The lower electrode layers 27 in this exemplary embodiment, as shown in FIG. 4, are provided separately for each of the pressure chambers 22, independently of each other. On the other hand, the upper electrode layer 29 in this exemplary embodiment extends continuously over a plurality of pressure chambers 22. Therefore, the lower electrode layers 27 are individual electrodes for each of the pressure chambers 22, and the upper electrode layer 29 is a common electrode that is common to the pressure chambers 22.

Concretely, in the pressure chamber juxtaposition direction (nozzle row direction), the width of the lower electrode layers 27 is smaller than the width of the pressure chambers 22 (more particularly, of the upper openings of the pressure chamber spaces) and the width of the piezoelectric material layer 28 on a region (first region) that corresponds to the pressure chambers 22. Furthermore, as shown in FIG. 3, an end portion of each lower electrode layer 27 at one side (a lower side in FIG. 3) in the longitudinal direction of the pressure chambers 22 (a direction orthogonal to the nozzle row direction) extends to the lead electrode portion 41 (described later) and another end portion of the lower electrode layer 27 at an another side (an upper side in FIG. 3) in the longitudinal direction extends beyond an end portion of the pressure chamber 22 (more specifically, an opening edge of the pressure chamber space) to a location that overlies the ink supply path 24 (more specifically, a location that overlies the ink supply path 24 in the stacking direction of the various layers). On the other hand, as shown in FIG. 4, two end portions of the upper electrode layer 29 in the pressure chamber juxtaposition direction extend to outer sides of the row of pressure chambers 22. Furthermore, as shown in FIG. 3, in the longitudinal direction of the pressure chambers 22, a one-side end portion of the upper electrode layer 29 extends beyond end portions of the pressure chambers 22 (more specifically, beyond an end portion of an upper opening edge of each pressure chamber space) into a region lying between the pressure chambers 22 and the lead electrode portions 41 and an another-side (opposite-side) end portion of the upper electrode layer 29 extends beyond end portions of the lower electrode layers 27 into an outer side of locations that overlie the ink supply paths 24.

As for the piezoelectric material layer 28, as shown in FIG. 3 and FIG. 5, a one-side end portion thereof in the longitudinal direction of the pressure chambers 22 extend beyond the one-side end portion of the upper electrode layer 29 to locations that overlie end portions of the lead electrode portions 41, and an another-side (opposite-side) end portion in the longitudinal direction extends beyond the end portions of the lower electrode layers 27 into the outer side of the locations that overlie the ink supply paths 24. In the pressure chamber juxtaposition direction, as shown in FIG. 3, the piezoelectric material layer 28 is formed over a plurality of pressure chambers 22 and is provided with a plurality of opening portions 28a that are formed in regions that correspond to regions lying between adjacent pressure chambers 22. These opening portions 28a are formed by removing corresponding portions of the piezoelectric material layer 28 by etching. That is, the opening portions 28a are formed at a pitch in the nozzle row direction which is equal to the formation pitch of the pressure chambers 22 (the formation pitch of the nozzles 25). Thus, between adjacent opening portions 28a, the piezoelectric element main bodies 19 each of which corresponds to one pressure chamber 22 are formed at a pitch equal to the formation pitch of the pressure chambers 22.

Furthermore, as shown in FIG. 4, a width of each of the portions of the piezoelectric material layer 28 over the pressure chamber spaces measured in the nozzle row direction (a distance between adjacent edges of the opening portions 28a) is less than the width of each pressure chamber 22 in the same direction and is greater than the width of each lower electrode layer 27 in the same direction. Further, as shown in FIG. 3, the length of the opening portions 28a in the longitudinal direction is less than the length of the pressure chambers 22 (more specifically, the length of the upper opening of each pressure chamber space) in the longitudinal direction. That is, both-side ends of the opening portions 28a in the longitudinal direction are at locations that are inward of both-side ends of the pressure chambers 22 (toward central portions of the pressure chambers 22). In this exemplary embodiment, the opening portions 28a have a hexagonal shape that is elongated in the longitudinal direction of the pressure chambers 22. Furthermore, regions of the piezoelectric material layer 28 apart from the opening portions 28a in the longitudinal direction of the pressure chambers 22 are formed continuously across portions of the plurality of pressure chambers 22.

A common metal layer 30 (that corresponds to a metal layer in the invention) extending continuously across both-side end portions of the pressure chambers 22 in the longitudinal direction thereof is stacked on both-side end portion regions of the piezoelectric element main bodies 19 in the longitudinal direction of the pressure chambers 22. This common metal layer 30 is stacked on the upper electrode layer 29, with the common close adherence layer 35 (that corresponds to a close adherence layer in the invention) interposed therebetween. That is, the common metal layer 30 is stacked on the common close adherence layer 35. The common metal layer 30 and the common close adherence layer 35 in this exemplary embodiment, as shown in FIG. 3, are formed continuously across the plurality of pressure chambers 22 and are formed at both sides of the opening portions 28a in a direction orthogonal to the nozzle row direction. The common metal layer 30 and the common close adherence layer 35 on each of the two opposite sides are formed continuously from a location that overlies a portion of a region that corresponds to the pressure chamber spaces (the first region of the vibration plate 21) to a location that overlies a portion of a region that is outwardly apart from the pressure chamber spaces in the longitudinal direction (the second region of the vibration plate 21).

Specifically, as shown in FIG. 3, the common metal layer 30a and the common close adherence layer 35a formed on the another side (the ink supply paths 24 side, that is, the upper side in FIG. 3) extend, in the longitudinal direction of the pressure chambers 22 (a direction in which the piezoelectric element main bodies 19 are elongated), from a region that corresponds to the another-side end portions of the opening portions 28a to a region beyond the pressure chambers 22 and the ink supply paths 24. In this exemplary embodiment, the common metal layer 30a and the common close adherence layer 35a on the another side are laid over an another-side end portion of each opening portion 28a having a hexagonal shape in a plan view which contains one of the six vertices and are also laid over an end portion of each pressure chamber 22 which contains the boundary with the ink supply path 24.

On the other hand, the common metal layer 30b and the common close adherence layer 35b formed on the one side (the nozzles 25 side, that is, the lower side in FIG. 3) extend, in the longitudinal direction of the pressure chambers 22, from a region that corresponds to the one-side end portions of the opening portions 28a to a region between the pressure chambers 22 and the lead electrode portions 41, beyond end portions of the pressure chambers 22 (more specifically, upper opening edges of the pressure chamber spaces). In this exemplary embodiment, as shown in FIG. 3, the common metal layer 30b and the common close adherence layer 35b on the one side are laid over a one-side end portion of each hexagonal opening portion 28a in a plan view which contains a vertex and are also laid over a one-side end portion of each pressure chamber 22. Furthermore, as shown in FIG. 5, the common close adherence layer 35b on the one side extends beyond locations that overlie the one-side common metal layer 30b into a region over a one-side end portion of the upper electrode layer 29 in the longitudinal direction. In this exemplary embodiment, the one-side end portion of the upper electrode layer 29 in the longitudinal direction and the one-side end portion of the common close adherence layer 35b in the longitudinal direction are aligned at the same location. In other words, in a region between the common metal layer 30b and the lead electrode portions 41 there is formed a region where a portion of the common close adherence layer 35b is exposed.

Incidentally, the common metal layer 30 and the common close adherence layer 35 on both sides extend on an outer side in the pressure chamber juxtaposition direction to a terminal region (not depicted) at a lead electrode portions 41 side. In this terminal region, the common metal layer 30 and the common close adherence layer 35 are electrically connected to a common electrode terminal of a wiring member. Furthermore, as shown in FIG. 5, a lower end portion of the closure plate 20 is joined, via the adhesive 37, to a region that is on a one-side end portion of the piezoelectric material layer 28 and that extends from an intermediate portion of the common metal layer 30b to end portions of the lead electrode portions 41. Thus, the region between the common metal layer 30b and the lead electrode portions 41 where a portion of the common close adherence layer 35b is exposed is protected by the adhesive 37.

The lead electrode portions 41, as shown in FIG. 3 and FIG. 5, are formed at locations that are in a region outwardly apart from one-side end portions of the pressure chambers 22 in the longitudinal direction and that are spaced from the upper electrode layer 29 by a predetermined distance. In this exemplary embodiment, another-side (piezoelectric element main bodies 19-side) end portions of the lead electrode portions 41 are layered on a one-side end portion of the piezoelectric material layer 28. More specifically, on the one-side end portion of the piezoelectric material layer 28, individual upper electrode layers 39, individual close adherence layers 45, and individual metal layers 40 are formed with a space provided from the upper electrode layer 29, the common close adherence layer 35b, and the common metal layer 30b, and are stacked in that order separately for each piezoelectric element main body 19, corresponding to each lower electrode layer 27. The individual upper electrode layers 39, the individual close adherence layers 45, and the individual metal layers 40 are electrically connected to the lower electrode layers 27 at an outer side of the piezoelectric material layer 28. One-side end portions of the lead electrode portions 41 (end portions thereof opposite to the piezoelectric element main bodies 19) extend to the terminal region (not depicted) and are electrically connected to individual electrode terminals of wiring members.

Since the common metal layer 30 is formed at a boundary between an inner side and an outer side of the pressure chambers 22 (more specifically, upper openings of the pressure chamber spaces) as described above, the common metal layer 30 restricts the piezoelectric element main bodies 19, which are active portions, so that excessive deformation of end portions of the piezoelectric element main bodies 19 can be inhibited. This weakens the stress that occurs at boundary locations between the active portions and the non-active portions. Furthermore, the piezoelectric element main bodies 19 extend into the outer side of the pressure chambers 22 (more specifically, the outer side of the upper openings of the pressure chamber spaces) and, in this extension-side region (i.e., a region at a side of extensions of the piezoelectric element main bodies 19 into the outer side of the pressure chambers 22), the common close adherence layer 35b extends as far outward as the upper electrode layer 29, which extends farther outward than the common metal layer 30b. Therefore, concentration of stress at boundary locations between the active portions and the non-active portions can be inhibited. Due to this, defective conditions in which cracks or the like occur in the piezoelectric material layer 28 when piezoelectric element main bodies 19 are deformed can be more certainly inhibited. Consequently, the reliability of the piezoelectric elements improves and, therefore, the reliability of the recording head 3 and the printer 1 improves.

Figure 6A:
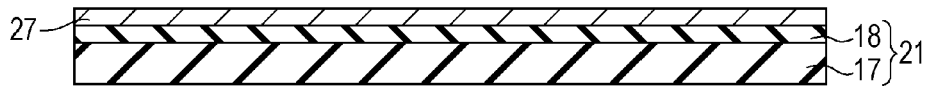
FIGS. 6A to 6F are each production process chart illustrating a production method for a piezoelectric element.
Figure 6B:
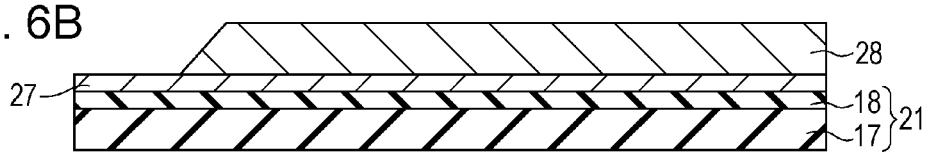
Figure 6C:
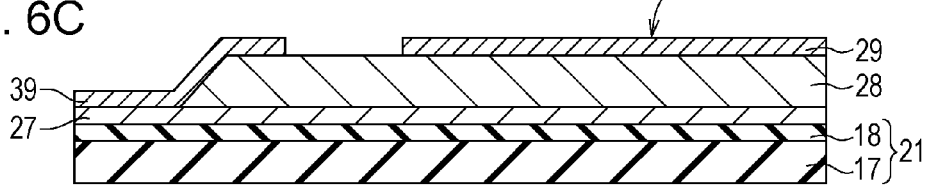

Next, a production method for piezoelectric elements as described above will be described. FIGS. 6A to 6F are process step drawings illustrating a production method for piezoelectric elements. Firstly, as shown in FIG. 6A, a thin film that is to be formed into lower electrode layers 27 is formed on a surface of the vibration plate 21 that is made up of the elastic film 17 and the insulator film 18, and then is patterned into the lower electrode layers 27 by a photolithography technology. Concretely, a resist mask according to the configuration of the lower electrode layers 27 is formed on this thin film through a step of applying a resist layer followed by an exposure step and a development step for the resist layer. After that, an etching step is performed to remove unnecessary portions of the thin film and then a resist removing step is performed to remove the resist mask, so that lower electrode layers 27 are formed. Next, as shown in FIG. 6B, a thin film that is to be formed into a piezoelectric material layer 28 is formed on the surface of the vibration plate 21 on which the lower electrode layers 27 have been formed, and then is patterned into the piezoelectric material layer 28 by a photolithography technology. Subsequently, as shown in FIG. 6C, a thin film that is to be formed into an upper electrode layer 29 and individual upper electrode layers 39 is formed on the surface of the vibration plate 21 on which the piezoelectric material layer 28 has been formed, and then is patterned into the upper electrode layer 29 and the individual upper electrode layers 39 by a photolithography technology. As a result, piezoelectric element main bodies 19 are formed.

Figure 6D:
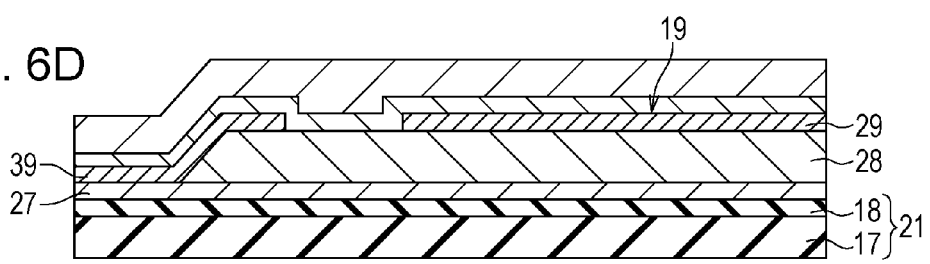
Figure 6E:
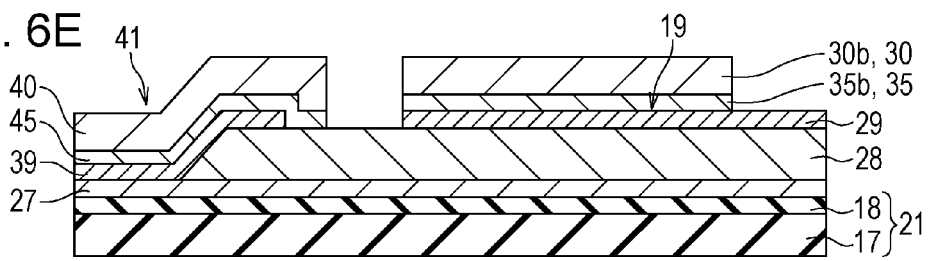
Figure 6F:
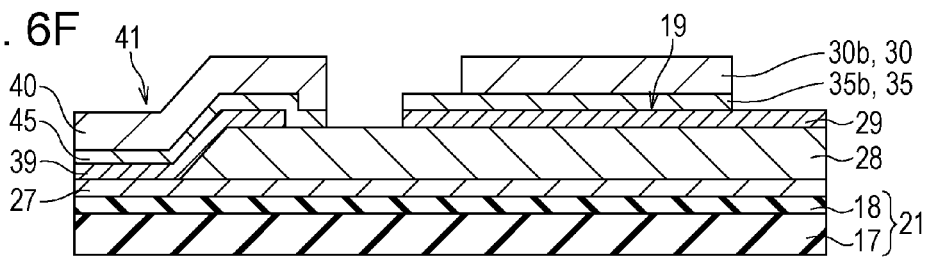

After the piezoelectric element main bodies 19 have been formed, a thin film that is to be formed into a common close adherence layer 35 and individual close adherence layers 45 is formed on the surface of the vibration plate 21 on which the piezoelectric element main bodies 19 have been formed, as shown in FIG. 6D. On top of the thin film, a thin film that is to be formed into a common metal layer 30 and individual metal layers 40 is formed. Subsequently, as shown in FIG. 6E, the two thin films are patterned into the configurations of the common close adherence layer 35 and the individual close adherence layers 45 by a photolithography technology. As a result, lead electrode portions 41 are formed and the common close adherence layer 35 is formed. At this time, the common metal layer 30b is also patterned into a configuration similar to that of the common close adherence layer 35b. Finally, as shown in FIG. 6F, photolithography is performed to carry out a partial removal of only a lead electrodes-side end portion of the common metal layer 30b at the one side, so as to form a common metal layer 30b with a one-side end having receded to the pressure chambers 22-side of the one-side end of the upper electrode layer 29. That is, a piezoelectric element in which the common close adherence layer 35 extends into the outer side of locations that overlie the common metal layer 30b is formed. Incidentally, the production method for piezoelectric elements is not limited to the foregoing method but may be any method as long as the method can form a configuration in which the common close adherence layer 35 extends beyond the locations that overlie the common metal layer 30b to an end portion of the upper electrode layer 29 in the longitudinal direction.

Although in the foregoing exemplary embodiment, the one-side common close adherence layer 35b extends beyond the locations that overlie the one-side common metal layer 30b to a one-side end portion of the upper electrode layer 29 in the longitudinal direction, the invention is not limited to this configuration. For example, it is permissible to adopt a configuration in which an another-side common close adherence layer extends beyond locations that overlie an another-side common metal layer to an another-side end portion of the upper electrode layer in the longitudinal direction. Furthermore, although in the foregoing exemplary embodiment, the pressure chambers 22 (pressure chamber spaces) have a trapezoidal shape in a plan view, this shape is not restrictive. Various shapes, for example, a parallelogram shape, a rectangular shape, etc., may be adopted as a shape of the pressure chambers 22. Further, although in the foregoing exemplary embodiment, the inner walls that partially demarcate the pressure chamber spaces in the longitudinal direction are inclined surface that are oblique to the upper and lower surfaces of the pressure chamber-forming substrate 15. For example, the inner walls that partially demarcate the pressure chamber spaces may be configured to be orthogonal to the upper and lower surfaces of the pressure chamber-forming substrate. Still further, although in the foregoing exemplary embodiment, the opening portions 28a of the piezoelectric material layer 28 have a hexagonal shape in a plan view, this shape is not restrictive. Various shapes, for example, a parallelogram shape, a rectangular shape, etc., may be adopted as a shape of the opening portions 28a.

Although an ink jet type recording head that is mounted in an ink jet printer has been exemplified above in conjunction with the foregoing embodiment, the invention is also applicable to apparatuses that eject liquids other than ink as long as the apparatuses have piezoelectric elements as described above. For example, the invention is also applicable to color material ejecting heads for use in producing color filters for liquid crystal displays and the like, electrode material ejecting heads for use in forming electrodes of organic electro-luminescence (EL) displays, surface emitting displays (SEDs), etc., bioorganic material ejecting heads for use in producing bio-chips (biochemical devices), etc.

Furthermore, the invention is applicable not only to liquid ejecting heads or what are used as actuators in liquid ejecting apparatuses but also to, for example, piezoelectric elements for use in various sensors and the like.

What is claimed is:

1. A piezoelectric element comprising:
    a support body having a first region that is allowed to flexurally deform and a second region that is at an outer side of the first region and that is inhibited from flexurally deforming;
    a piezoelectric element main body in which a first electrode layer, a piezoelectric material layer, and a second electrode layer are stacked in that order on the first region of the support body; and
    a metal layer that is stacked on the second electrode layer, with a close adherence layer interposed between the metal layer and the second electrode layer,
    wherein a portion of the piezoelectric element main body extends into the second region, and
    wherein in an extension-side region that is a region at a side of extension of the portion of the piezoelectric element main body into the second region, the metal layer is formed continuously from a location that overlies the first region to a location that overlies the second region and the close adherence layer extends beyond a location that overlies the metal layer to an end portion of the second electrode layer.

2. A liquid ejecting head comprising the piezoelectric element according to claim 1.

3. A liquid ejecting apparatus comprising the liquid ejecting head according to claim 2.

* * * * *